US008388924B2

(12) United States Patent
Radhakrishnan et al.

(10) Patent No.: US 8,388,924 B2
(45) Date of Patent: Mar. 5, 2013

(54) METHOD FOR GROWTH OF HIGH QUALITY GRAPHENE FILMS

(75) Inventors: Gouri Radhakrishnan, Rancho Palos Verdes, CA (US); Paul Michael Adams, Redondo Beach, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 13/091,701

(22) Filed: Apr. 21, 2011

(65) Prior Publication Data

US 2012/0269717 A1  Oct. 25, 2012

(51) Int. Cl.
*C01B 31/04* (2006.01)
(52) U.S. Cl. .................. 423/448; 977/734
(58) Field of Classification Search .............. 423/448; 977/734
See application file for complete search history.

(56) References Cited

U.S. PATENT DOCUMENTS

| 7,504,570 B2 * | 3/2009 | Kawabata ............... 423/445 B |
| 2010/0239869 A1 | 9/2010 | Huang et al. |
| 2010/0301212 A1 | 12/2010 | Dato et al. |
| 2011/0030991 A1 | 2/2011 | Veerasamy |
| 2011/0042649 A1 | 2/2011 | Duvall et al. |
| 2011/0046026 A1 | 2/2011 | Xiao et al. |

OTHER PUBLICATIONS

A simple alcohol-chemical vapor deposition synthesis of single-layer graphenes using flash cooling Yasumitsu Miyata, Keiichi Kamon, Kazunori Ohashi, Ryo Kitaura, Masamichi Yoshimura, and Hisanori Shinohara, Appl. Phys. Lett. 96, 263105 (2010), DOI:10.1063/1.3458797.*

"An extended defect in graphene as a metallic wire" Jayeeta Lahiri, You Lin, Pinar Bozkurt. Nature Nanotechnology 5, 326-329 (2010) Published online: Mar. 28, 2010 | doi:10.1038/nnano.2010.53.*
Alfonso Reina, et al., Large Area, Few-Layer Graphene Films on Arbitrary Substrates by Chemical Vapor Deposition, American Chemical Society, Nano Letters 2009, vol. 9, No. 1, pp. 30-35, Published on Web Dec. 1, 2008.
Xuesong Li, et al., Evolution of Graphene Growth on Ni and Cu by Carbon Isotope Labeling, American Chemical Society, Nano Letters 2009, vol. 9, No. 12, pp. 4268-4272, Published on Web Aug. 27, 2009.
Xuesong Li, et al., Large- Area Synthesis of High-Quality and Uniform Graphene Films on Copper Foils, Science, www.sciencemag.org/cgi/content/full/1171245/DCI, Published May 7, 2009 on Science Express.
Anchal Srivastava, et al., Novel Liquid Precursor-Based Facile Synthesis of Large-Area Continuous, Single, and Few-Layer Graphene Films, American Chemical Society, Chem. Mater. 2010, 22, pp. 3457-61, Published on Web May 14, 2010.
Xuesong Li, et al., Graphene Films with Large Domain Size by a Two-Step Chemical Vapor Deposition Process, American Chemical Society, Nano Letters 2010, 10, pp. 4328-4334, Published on Web Oct. 19, 2010.
Lewis Gomez De Arco, et al., Synthesis, Transfer, and Devices of Single- and Few-Layer Graphene by Chemical Vapor Deposition, IEEE Transactions on Nanotechnology, vol. 8, No. 2, Mar. 2009, pp. 135-138.
Kwanpyo Kim, et al., Grain Boundary Mapping in Polycrystalline Graphene, ACS Nano, vol. 5, No. 3, pp. 2142-2146, Published on Web Jan. 31, 2011.

* cited by examiner

*Primary Examiner* — Daniel C McCracken
*Assistant Examiner* — Richard M Rump
(74) *Attorney, Agent, or Firm* — Sutherland Asbill & Brennan

(57) ABSTRACT

The present application relates generally to methods for growth of high quality graphene films. In particular, a method is provided for forming a graphene film using a modified chemical vapor deposition process using an oxygen-containing hydrocarbon liquid precursor. Desirably, the graphene films are a single-layer and have a single grain continuity of at least 1 $\mu m^2$.

17 Claims, 7 Drawing Sheets

Location 3   Location 4   Location 5
Location 6   Location 7   Location 8

Fig. 4B

Location 1   Location 9

Fig. 4C

Location 10

D

METHOD FOR GROWTH OF HIGH QUALITY GRAPHENE FILMS

TECHNICAL FIELD

Embodiments of the present description relate to methods for growth of high quality graphene films. More particularly, methods for growth of graphene films are provided using liquid precursors in modified chemical vapor deposition processes.

BACKGROUND

Graphene, which consists of one or more atomic layers of graphite, has attracted a tremendous interest in recent years due to its unique electron mobility and physical properties. The electrical properties of graphene are largely influenced by its grain size and by the atomic structure at the grain boundaries. Such effects are even more pronounced in a two dimensional crystal where minor defects can disrupt the crystal structure.

Existing methods for making graphene generally include exfoliation from highly oriented pyrolytic graphite, desorption of silicon from silicon carbide single crystals, and chemical vapor deposition from gaseous methane/hydrogen mixtures. These methods, however, have numerous limitations and generally fail to produce graphene films that are large in area and also have large single crystal grains. For example, exfoliation limits the size of graphene layers while desorption from silicon carbide forms 2- and 3-layer graphene. Although chemical vapor deposition from gaseous methane/hydrogen mixtures is widely used for large area monolayer graphene, typically only small polycrystalline grains have been reported.

Thus, there exists a need for alternative methods for large-scale synthesis of a graphene monolayer over large areas that is clean and highly ordered, i.e., with large single crystal grains. Moreover, there is a need to reduce defects in the formation of the graphene structure (e.g., heptagonal or pentagonal structures instead of the repeating hexagonal structures) while also increasing the grain size.

Additional aspects will be set forth in part in the description which follows, and in part will be obvious from the description, or may be learned by practice of the aspects described below. The advantages described below will be realized and attained by means of the elements and combinations particularly pointed out in the appended claims. It is to be understood that both the foregoing general description and the following detailed description are exemplary and explanatory only and are not restrictive.

BRIEF SUMMARY OF THE DESCRIPTION

Embodiments of the present application address the above-described needs by providing a graphene film and a method of forming a graphene film comprising: replacing at least a portion of air in a reactor having a substrate disposed therein with a buffer gas; flowing the buffer gas through the reactor and heating the reactor; and passing the buffer gas through an oxygen-containing hydrocarbon liquid precursor to bring the oxygen-containing hydrocarbon liquid precursor into contact with the substrate for a time sufficient to form a graphene film. Desirably, the graphene film is a single-layer comprising a single grain continuity of at least 1 $\mu m^2$.

DETAILED DESCRIPTION

Embodiments of the present invention address the above-described needs by providing methods for forming a high quality graphene film comprising replacing at least a portion of air in a reactor having a substrate disposed therein with a buffer gas; flowing a buffer gas through the reactor and heating the reactor; and passing the buffer gas through an oxygen-containing hydrocarbon liquid precursor to bring the oxygen-containing hydrocarbon liquid precursor into contact with the substrate for a time sufficient to form a graphene film. The high quality graphene films desirably are a single-layer comprising a single grain continuity of at least 1 $\mu m^2$.

The methods provided herein differ from conventional methods and advantageously work well at pressures greater than those conventionally used, provide opportunities for doping the graphene using solid or gas phase materials, enable deposition of graphene films on alternative substrates, and surprisingly result in the formation of single layer films having single grain sizes and single grain uniformity not previously achieved.

In an embodiment, the method for forming a high quality graphene film comprises replacing at least a portion of air in a reactor having a substrate disposed therein with a buffer gas. In one embodiment, the step of replacing at least a portion of air comprises first pumping down of the reactor to an initial pressure of less than atmospheric. In embodiments, the initial pressure is about 10 mTorr to about 40 mTorr, about 20 mTorr to about 40 mTorr, or about 30 mTorr to about 40 mTorr. For example, in a particular embodiment the initial pressure is about 40 mTorr. Alternatively, the replacing of at least a portion of air in the reactor with a buffer gas comprises flowing the buffer gas through the reactor for a time sufficient to purge air and other impurities from the reactor. In other embodiments, the reactor is operated under ambient pressures (about 760 Torr) after first pumping down the reactor.

The buffer gas may comprise any suitable carrier gas and desirably comprises an inert gas. Non-limiting examples of suitable buffer gasses include argon, nitrogen, or other forming gas (i.e., argon with less than 4% hydrogen gas). Desirably, the buffer gas has a high purity and is substantially free of hydrogen gas ($H_2$).

According to an embodiment, the buffer gas flows from a source of the buffer gas through a bubbler holding the oxygen-containing hydrocarbon liquid precursor to bring the oxygen-containing hydrocarbon liquid precursor into contact with the substrate in the reactor. In particular embodiments, the oxygen-containing hydrocarbon liquid precursor comprises a C1-C10 oxygen-containing hydrocarbon, non-limiting examples of which include methanol, ethanol, iso-propanol, and acetone. According to an embodiment, the oxygen-containing hydrocarbon liquid precursor is maintained at a temperature of about 15 to about 25° C. in the bubbler. Those skilled in the art will appreciate that the temperature of the liquid precursor may be varied to better control the conditions of the reactor, as the vapor pressure of the liquid precursor is lower at lower temperatures. For example, in particular embodiments the ratio of the partial pressure of the buffer gas to the partial pressure of the liquid precursor is from 50:1 to 2:1. In other particular embodiments, however, the oxygen-containing hydrocarbon liquid precursor may be brought into contact with the substrate without use of a buffer gas using means known to those skilled in the art.

In embodiments, the reactor is heated before bringing the oxygen-containing hydrocarbon liquid precursor into contact with a substrate disposed in the reactor. The temperature of the reactor desirably is sufficient for the deposition of the oxygen-containing hydrocarbon liquid precursor on the substrate. Accordingly, in embodiments the reactor is at a temperature suitable for the decomposition of the oxygen-containing hydrocarbon liquid precursor and less than the melting point of the metal substrate. In some cases, the upper limit of the reactor temperature also may be limited by the decomposition of the oxygen-containing hydrocarbon liquid precursor. Thus, according to embodiments, the reactor is at a temperature between about 600 and about 1200° C., about 900 and about 1200° C., or about 1000 and about 1200° C. For example, in embodiments the reactor temperature suitable for deposition of graphene is between about 900 and about 1050° C. for a copper substrate with methanol precursor or between about 1000 and about 1200° C. for a nickel substrate with a methanol precursor.

In embodiments, the flow of the buffer gas through the reactor is at a flow rate and for a time sufficient to form a graphene film. In particular embodiments, the buffer gas has a flow rate of about 100 sccm to about 500 sccm, about 100 sccm to about 400 sccm, or about 200 sccm to about 400 sccm. For example, in a particular embodiment the buffer gas has a flow rate of about 300 sccm. Those skilled in the art will appreciate that the flow rate may be controlled using any suitable means, for example, a mass flow controller. In embodiments, the time sufficient to form the graphene film is about 5 minutes to about 30 minutes, about 10 minutes to about 25 minutes, or about 20 minutes.

The substrate may comprise any suitable surface for forming a graphene film, non-limiting examples of which include copper, nickel, gold, platinum, silver, ruthenium, rhodium, cobalt, and iron. The substrate may have any thickness suitable for deposition of a graphene film. For example, in embodiments the substrate has a thickness between about 50 nm and 50 µm.

The methods provided herein optionally further comprise annealing the substrate prior to passing the buffer gas through the oxygen-containing hydrocarbon liquid precursor. For example, in an embodiment the step of annealing comprises maintaining the reactor at a temperature below the melting point of the metal substrate prior to passing the buffer gas through the oxygen-containing hydrocarbon liquid precursor (for example, the reactor temperature may be maintained below 1083° C. for a copper substrate or below 1400° C. for nickel). Not wishing to be bound by any theory, it is believed that the annealing of the substrate promotes formation of larger grain sizes. Thus, in embodiments the annealing temperature is one that is both below the melting point of the metal substrate and sufficient to increase the grain size of the graphene. For example, in embodiments the step of annealing comprises maintaining the reactor at a temperature from about 900 to about 1200° C. According to an embodiment, the method may still further comprise chemically etching or otherwise pretreating the substrate prior to annealing the substrate using methods known to those skilled in the art. Not wishing to be bound by any theory, it is believed that chemical etching or otherwise pretreating the substrate both removes existing oxide and inhibits oxide formation. For example, in particular embodiments the chemical etching comprises etching a copper substrate with a dilute solution of ammonium peroxydisulfate in water for about 10 minutes, rinsed with deionized water, and dried in dry nitrogen gas.

According to an embodiment, the methods provided herein also may include doping of the graphene films using methods generally known to those skilled in the art. For example, in particular embodiments the doping of the graphene films comprises pre-implanting of one or more solid state dopants in the substrate prior to placing the substrate in the reactor and causing the solid state dopants to migrate into the graphene film when the graphene film is applied to the substrate. Non-limiting examples of dopants include nitrogen, oxygen, phosphorus, and boron.

In embodiments, after the formation of the graphene film, the method further comprises cooling the substrate and graphene film disposed thereon to about room temperature. The cooling may be done either within the reactor.

According to an embodiment, the graphene film may be transferred subsequently from the substrate. For example, the graphene film may be released or debonded from the substrate so that it may be incorporated into an intermediate or final product. In particular embodiments, the graphene film is released or debonded from the substrate by applying a release layer (e.g., a polymer layer, Scotch® tape, or Kapton® tape) directly onto the graphene film prior to etching away the substrate.

The graphene films provided herein are clean and highly ordered with few lattice imperfections and impurities. Desirably, the graphene films comprise a single layer of graphene.

Whether the graphene film is a single layer may be determined by using Raman spectroscopy to characterize the graphene film. For example, the graphene film quality may be characterized by comparing the ratio of the intensity of the Raman spectra of the graphene film for the characteristic G' peak (~2700 cm$^{-1}$) and G peak (~1585 cm$^{-1}$). In embodiments, the graphene film is characterized as having a ratio of intensities of the G':G peaks of at least 4. In other embodiments, the graphene film is characterized as having a ratio of the intensities of the G':G peaks of at least 5.

The high quality of the graphene films also desirably are characterized by the grain size and grain continuity. In particular embodiments, the one or more grains have a single grain continuity of at least 1 µm$^2$, at least 10 µm$^2$, or at least 30 µm$^2$. For example, in a particular embodiment the single layer graphene film has a single grain continuity of at least 30 µm$^2$.

The graphene films provided herein may be used in any suitable application known to those skilled in the art. In particular embodiments, the graphene films are particularly suitable for use in electronic devices, non-limiting examples of which include RF devices, lithium ion batteries, transparent electrodes/displays, solar cells, organic photovoltaic devices, field emission tips, chemical sensors, magnetic sensors, and optoelectronic devices.

Embodiments of the present description are further illustrated by the following examples, which are not to be construed in any way as imparting limitations upon the scope thereof. On the contrary, it is to be clearly understood that resort may be had to various other embodiments, modifications, and equivalents thereof which, after reading the description therein, may suggest themselves to those skilled in the art without departing from the spirit of the present invention and/or the scope of the appended claims. Unless otherwise specified, quantities referred to by percentages (%) are by weight (wt %).

EXAMPLES

Figure 1:
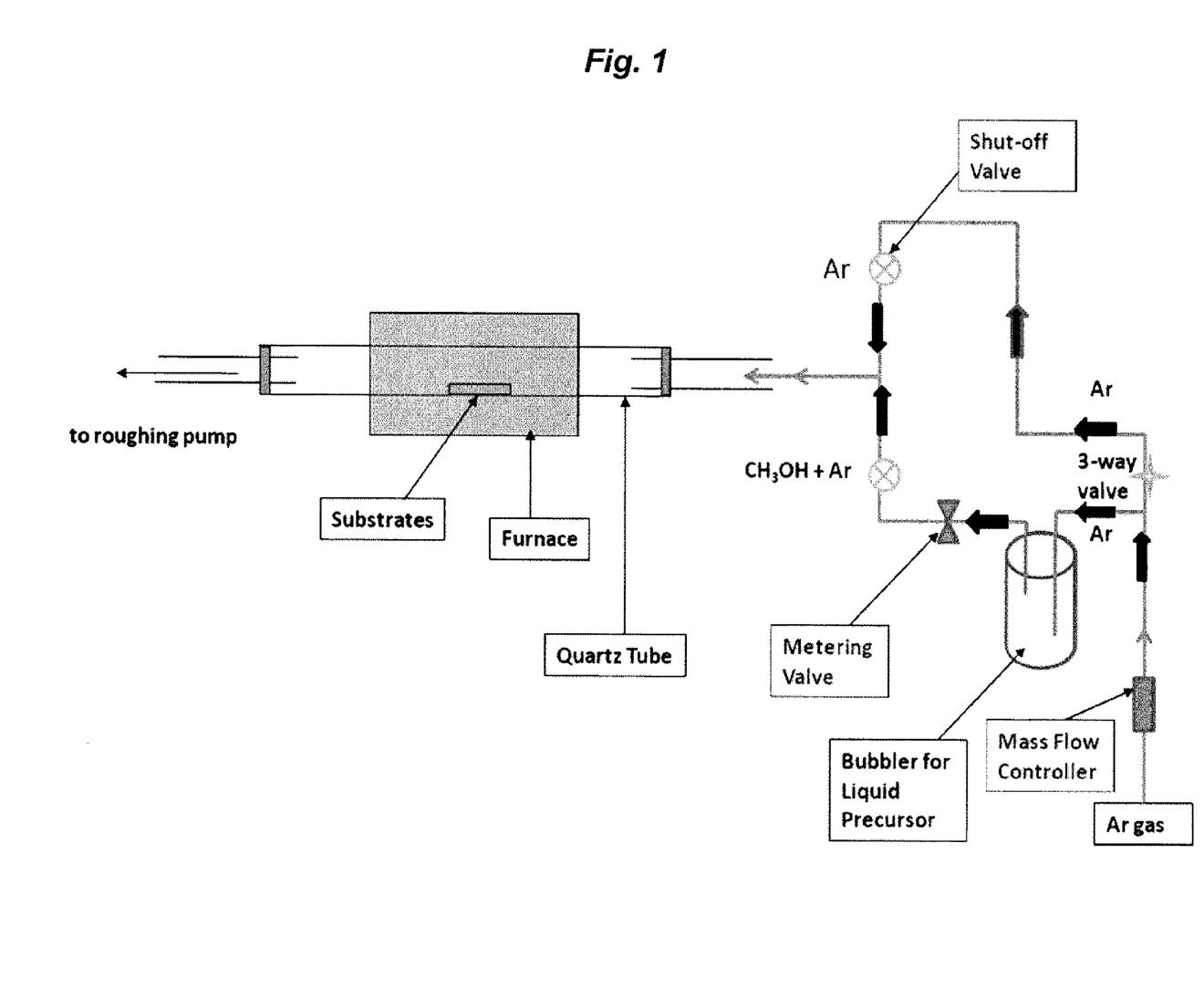
FIG. 1 is an illustration of a reactor for preparing a graphene film according to embodiments of the method herein.

Single layer graphene films were prepared using the reactor illustrated in FIG. 1, which included a source of argon gas, three-way valve, bubbler, and tube furnace. A metal substrate was disposed in the tube furnace before pumping down the tube furnace with a roughing pump to a vacuum level of 40 mTorr.

Thereafter, a high purity argon gas was introduced to the furnace at a flow rate of 300 sccm. The argon flow rate was controlled with a mass flow controller and was directed either into the furnace or into a bubbler which held a liquid precursor. The Argon pressure was maintained between 55 Torr and 60 Torr.

While maintaining the argon flow, the furnace was heated from room temperature (about 23-25° C.) to a temperature of 1000° C. The metal substrate was held at this temperature for a period of about 20 minutes in order to anneal the substrate. Following the annealing, the furnace was further heated to 1050° C. and the argon was directed into the bubbler holding a liquid methanol to transport the methanol into the heated furnace. The metering valve at the output of the bubbler was controlled to regulate the partial pressure of the methanol, and thus allowed control on the ratio of the Argon partial pressure to methanol partial pressure. After 15-20 minutes, the furnace was turned off and the metal substrate was allowed to cool back to room temperature.

Figure 2A:
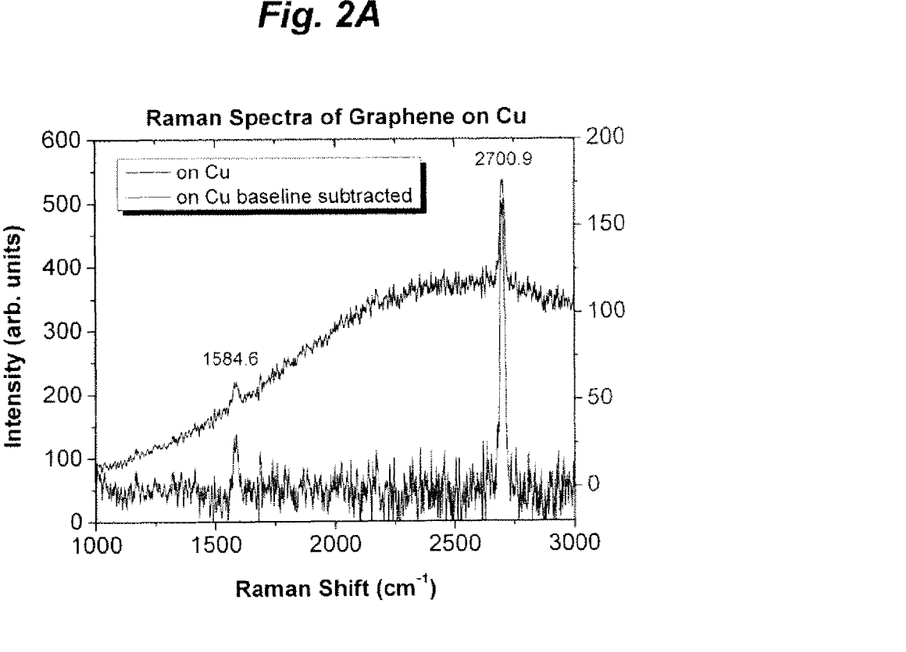
FIGS. 2A-2C are Raman Spectrum of a graphene film on copper (2A), of a graphene film transferred to a holey-C TEM grid (2B), and of a graphene film transferred to 300-nm $SiO_2$ on Si following deposition on copper (2C).
Figure 2B:
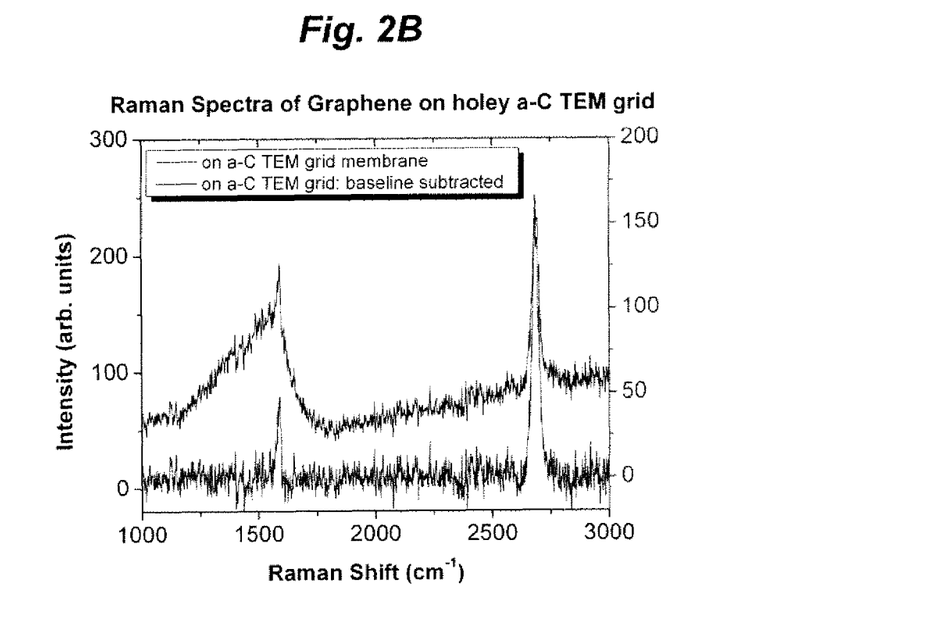
Figure 2C:
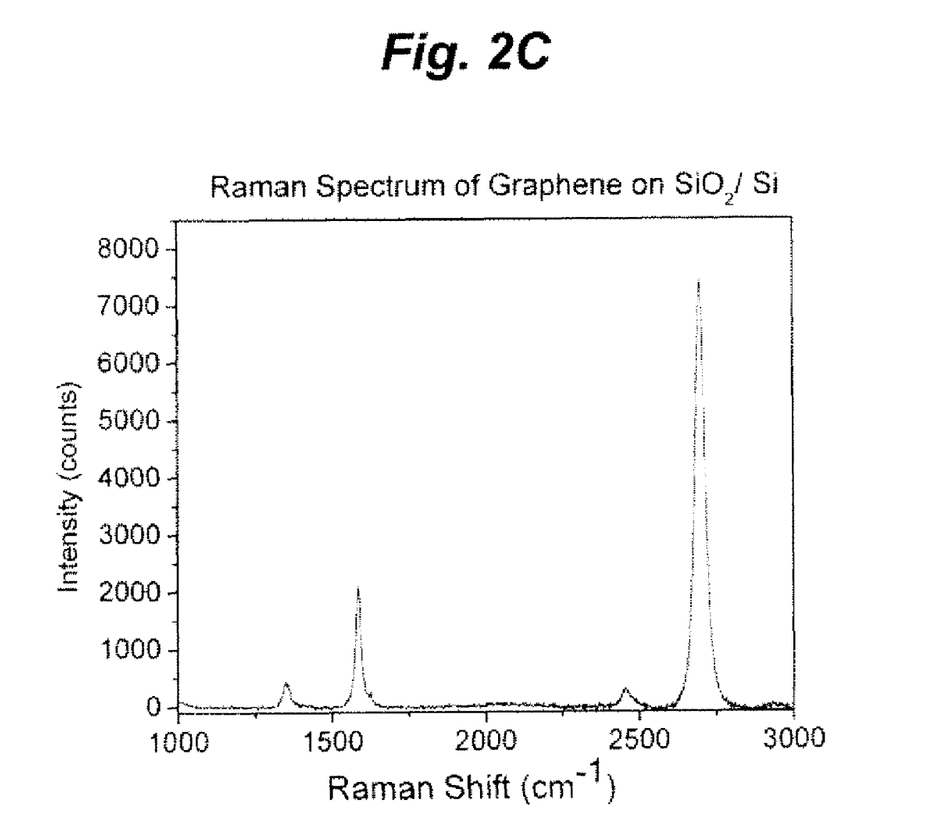

The graphene films formed on the metal substrate were analyzed using a commercial Raman spectrometer (Renishaw InVia Micro Raman Spectrometer) using 514 nm laser excitation (<1 mW). As illustrated in FIGS. 2A-2C, characteristic Raman signature from graphene were obtained, with a G peak at approximately 1585 cm$^{-1}$ and G' peak at approximately 2700 cm$^{-1}$. In addition, it was determined that the graphene was a monolayer from the ratio of the intensities of the G':G peaks $I_{G'}:I_G$, which was equal to or greater than 4, and the ability to fit the G' peak with a single Lorentz function having a narrow (20-35 cm$^{-1}$) full-width half maximum.

Figure 3A:
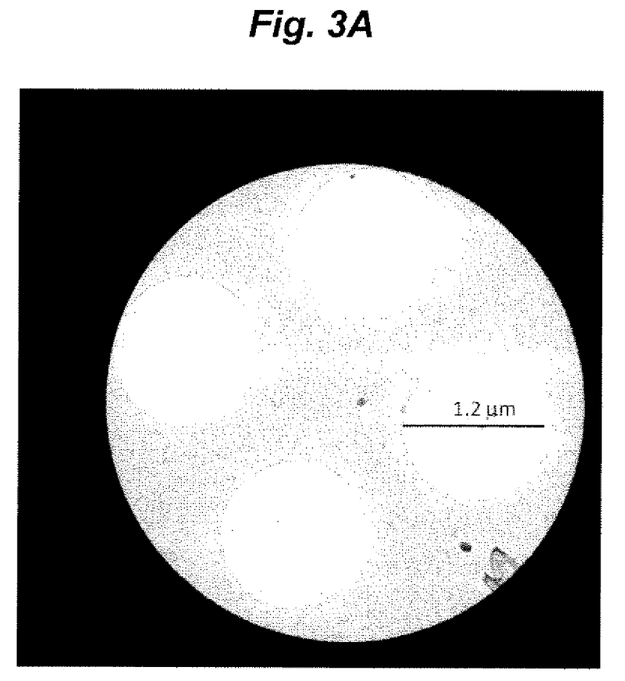
FIGS. 3A and 3B are transmission electron microscopy (TEM) of a graphene film on a holey-C grid.
Figure 3B:
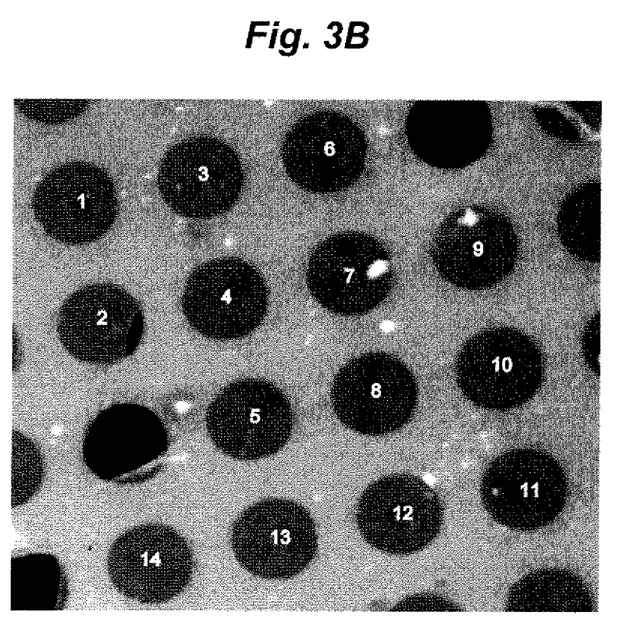
Figure 4A:
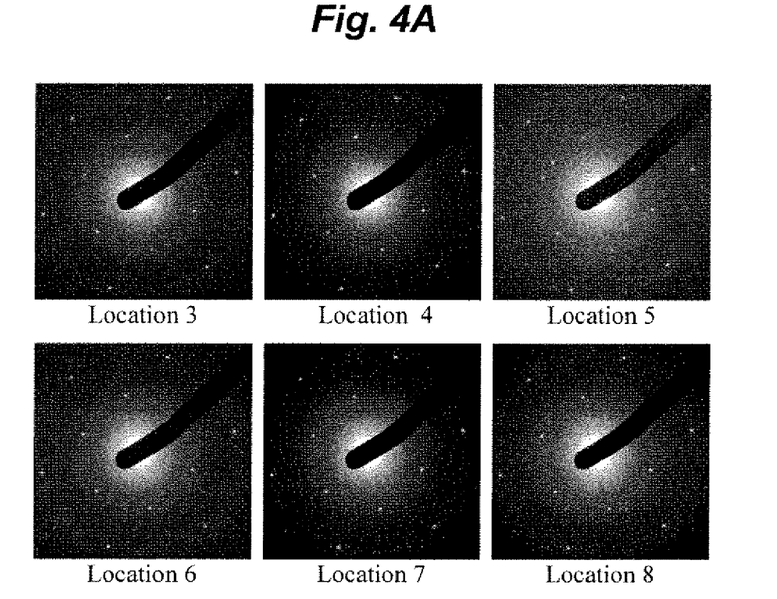
FIGS. 4A-4C are selected area electron diffraction patterns taken in a TEM at individual hole locations of the graphene film of FIG. 3B.
Figure 4B:
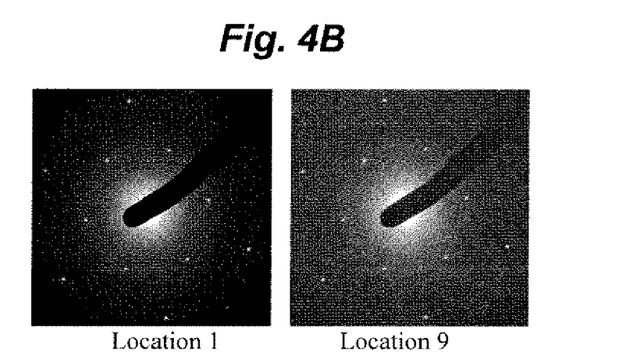
Figure 4C:
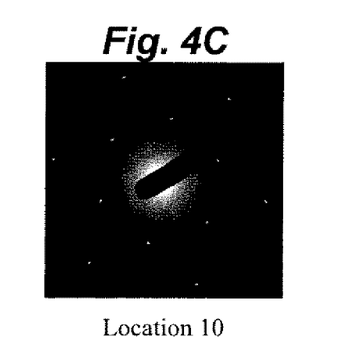
Figure 5A:
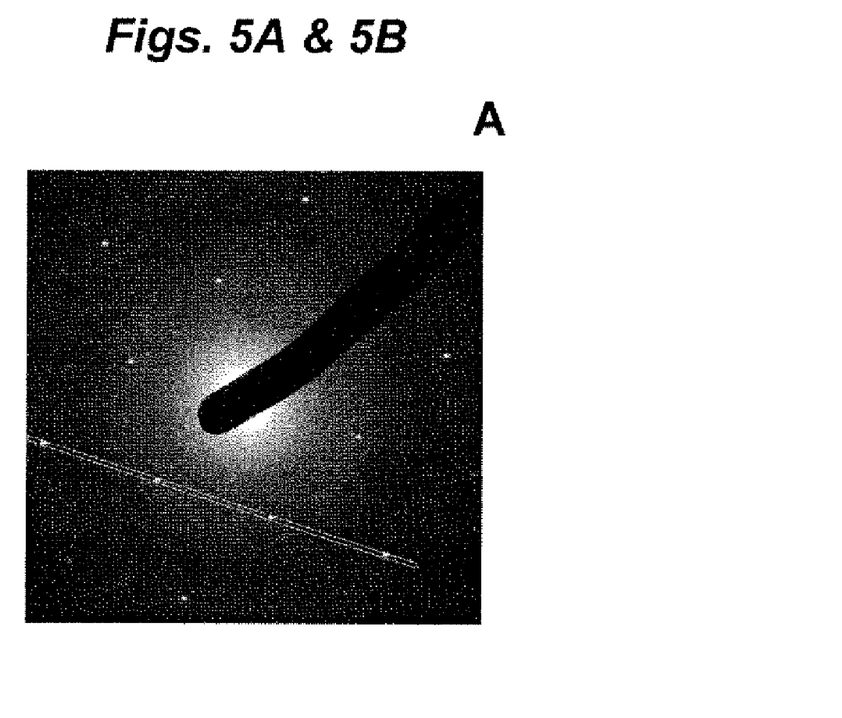
FIGS. 5A and 5B are the selected area electron diffraction pattern at location 4 of the graphene film of FIG. 3B and the graph of the intensities at spots from the inner hexagon and outer hexagon.
Figure 5B:
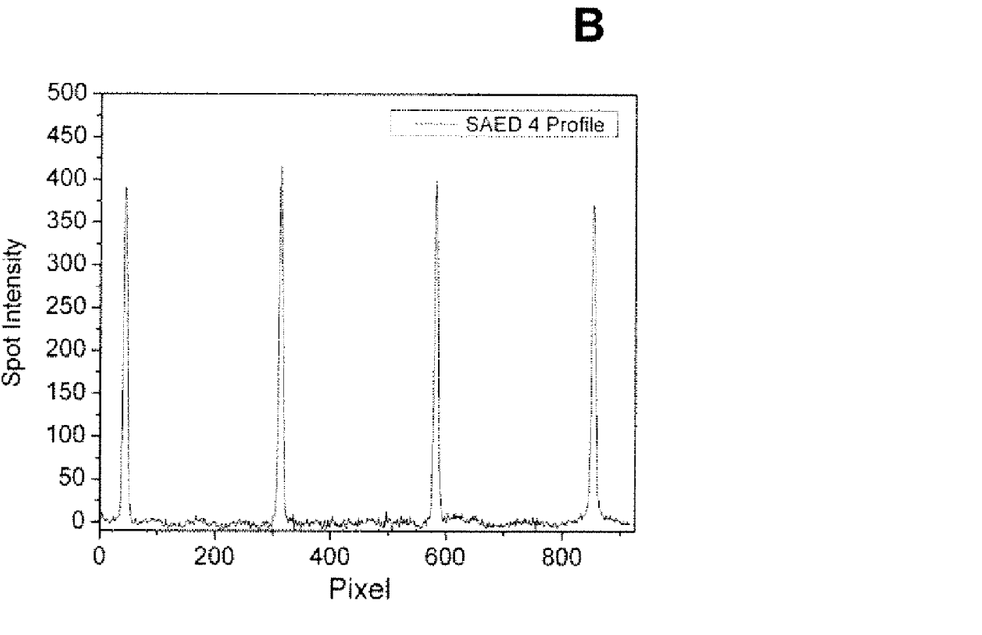
Figure 6A:
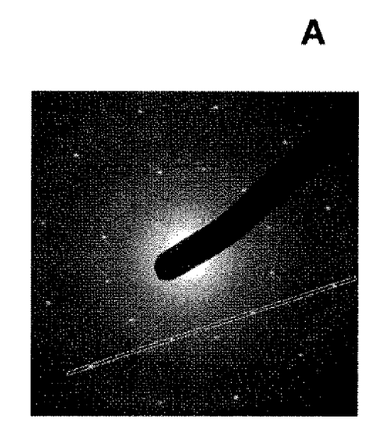
FIGS. 6A-6D are selected area electron diffraction patterns of two hexagon spot patterns at location 13 of the graphene film of FIG. 3B and graphs of the intensities at spots from the inner and outer hexagon of each hexagon spot pattern.
Figure 6B:
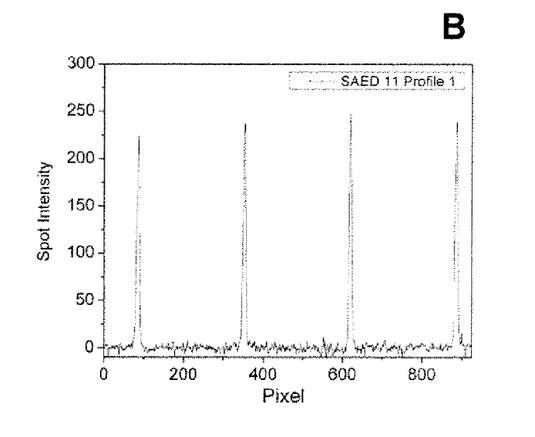
Figure 6C:
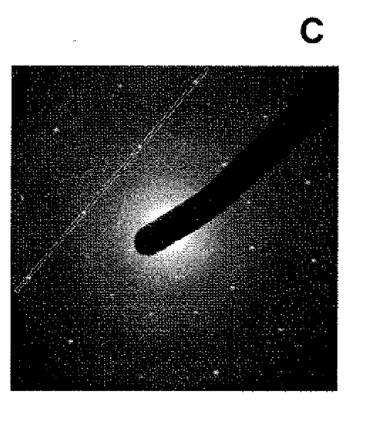
Figure 6D:
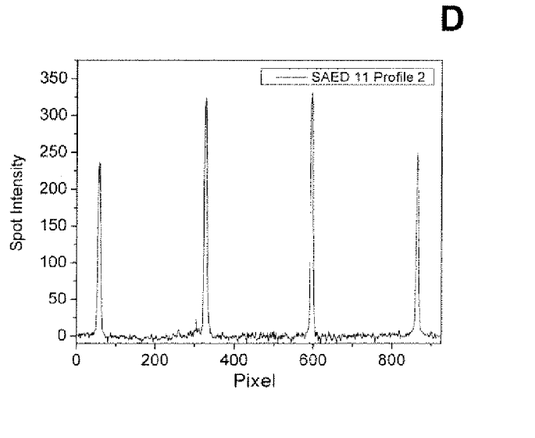

The graphene films were further characterized by transmission electron microscopy (TEM) of the graphene film over a TEM holey-C grid (FIGS. 3-5). Survey selected area electron diffraction patterns were taken from areas with a 4-μm diameter (FIG. 3A). Selected area electron diffraction patterns (FIG. 4A-4C) taken in at the numbered individual hole locations (FIG. 3B) showed that the film had a hexagonal spot pattern and spacing characteristic of a hexagonal single crystal carbon lattice. The selected area electron diffraction patterns of locations 3-8 had the same orientation (FIG. 4A), locations 1 and 9 also had the same orientation but were rotated 23 degrees with respect to the grain in locations 3-8 (FIG. 4B), while location 10 showed a different grain rotated 33 degrees with respect to the grain in locations 3-8. Analysis of the intensities from numerous selected area diffraction pattern locations (FIGS. 5A-5B) showed that the intensities of the (1-100) spots from the inner hexagon were comparable to or greater than the intensities of the (11-20) spots from the outer hexagon, providing further evidence that the graphene film was a single layer. A similar analysis of the intensities was conducted for the selected area diffraction pattern at location 13, which showed multiple hexagonal spot patterns (FIGS. 6A-6D). The intensities taken along two sets of inner and outer spots pairs indicated that both hexagonal spot patterns corresponded to a single-crystal graphene and the area straddled a grain boundary rather than representing a rotated stacked multilayer graphene film.

While the invention has been described in detail with respect to specific embodiments thereof, it will be appreciated that those skilled in the art, upon attaining an understanding of the foregoing, may readily conceive of alterations to, variations of, and equivalents to these embodiments. Accordingly, the scope of the present invention should be assessed as that of the appended claims and any equivalents thereof.

The invention claimed is:

1. A method of forming a graphene film comprising:
   replacing at least a portion of air in a reactor having a substrate disposed therein with a buffer gas;
   flowing the buffer gas through the reactor and heating the reactor; and
   passing the buffer gas through a methanol liquid precursor to bring the methanol liquid precursor into contact with the substrate for a time sufficient to form a graphene film, wherein the ratio of the buffer gas partial pressure to the methanol liquid precursor partial pressure is from 50:1 to 2:1,
   wherein the graphene film is a single-layer comprising a single grain continuity of at least 1 μm$^2$.

2. The method of claim 1, wherein the step of heating the reactor comprises heating the reactor to a temperature that is sufficient for decomposition of the methanol liquid precursor and less than the substrate melting point.

3. The method of claim 2, wherein the temperature is from 600° C. to 1200° C.

4. The method of claim 1, further comprising annealing the substrate by heating and maintaining the reactor at a temperature from about 900° C. to 1200° C. and thereafter heating or cooling the reactor to a temperature that is sufficient for decomposition of the methanol liquid precursor and less than the substrate melting point prior to passing the buffer gas through the methanol liquid precursor.

5. The method of claim 4, further comprising etching the substrate prior to annealing the substrate.

6. The method of claim 1, further comprising cooling the graphene film disposed on the substrate to about room temperature.

7. The method of claim 1, wherein the buffer gas has a flow rate of about at a flow rate from about 100 sccm to about 500 sccm.

8. The method of claim 1, wherein the buffer gas comprises argon.

9. The method of claim 1, wherein the buffer gas is substantially free of hydrogen gas ($H_2$).

10. The method of claim 1, wherein the substrate comprises copper or nickel.

11. The method of claim 1, wherein the time sufficient to form the graphene film is about 20 minutes.

12. The method of claim 1, wherein the graphene film comprises a grain size from about 10 to about 30 μm$^2$.

13. The method of claim 1, wherein the ratio of the intensities of G':G peaks as measured from a Raman Spectrum of the graphene film is at least 4.

14. The method of claim 1, wherein the ratio of the intensities of G':G peaks as measured from a Raman Spectrum of the graphene film is at least 5.

15. The method of claim 1, wherein the substrate has a thickness from about 50 nm to about 50 μm.

16. A method of forming a graphene film comprising:
replacing at least a portion of air in a reactor having a substrate disposed therein with a buffer gas by reducing the reactor pressure to a pressure from 1 mTorr to 40 mTorr;
flowing the buffer gas through the reactor and heating the reactor; and
passing the buffer gas through an oxygen-containing hydrocarbon liquid precursor to bring the oxygen-containing hydrocarbon liquid precursor into contact with the substrate for a time sufficient to form a graphene film,
wherein the graphene film is a single-layer comprising a single grain continuity of at least 1 $\mu m^2$.

17. The method of claim 16, wherein the reactor is pumped down to a pressure of 10 mTorr to 40 mTorr.

* * * * *